PIEZOELECTRIC CERAMIC MATERIALS
Filed March 8, 1965
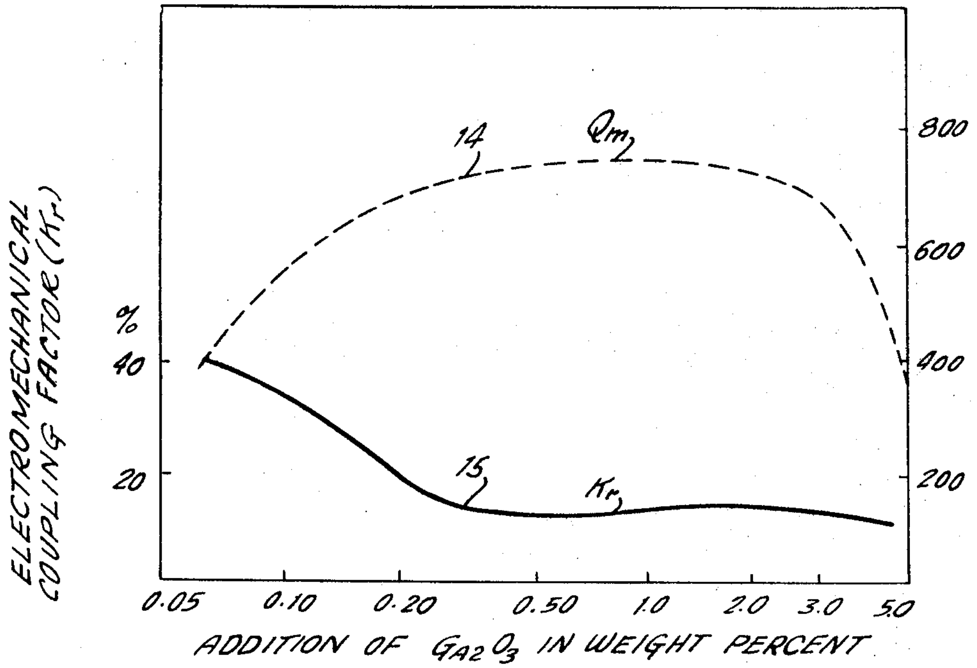
INVENTORS
TSUNEO AKASHI
MASAO TAKAHASHI
BY FUMIO YAMAUCHI
NORIO TSUBOUCHI
TOMEJI OHNO
OSTROLENK, FABER, GERB & SOFFEN
ATTORNEYS United States Patent Office 3,522,182
Patented July 28, 1970

3,522,182
PIEZOELECTRIC CERAMIC MATERIALS

Tsuneo Akashi, Masao Takahashi, Fumio Yamauchi, Norio Tsubouchi, and Tomeji Ohno, Tokyo, Japan, assignors to Nippon Electric Company, Limited, Minatoku, Tokyo, Japan Filed Mar. 8, 1965, Ser. No. 437,910
Claims priority, application Japan, Mar. 10, 1964, 39/13,217, 39/13,218; Aug. 28, 1964, 39/49,085
Int. Cl. C04b *35/46, 35/48*
U.S. Cl. 252—62.9 2 Claims

ABSTRACT OF THE DISCLOSURE

Lead titanate zirconate ceramic compositions incorporating gallium sesquioxide in amounts of from 0.05 to 5.0 weight percent to 10.0 weight percent. The additive constituent markedly increases the mechanical quality factor of the basic ceramic compositions, and adjust the electromechanical coupling factor thereof to any predetermined value within a broad range to thus adapt the basic ceramic compositions for optimum use in transducers or as ceramic filter elements, as may be desired.

The instant invention relates to piezoelectric elements and more particularly to a piezoelectric material having a novel composition including an additive which is quite advantageous for use in both improving and controlling the electromechanical coupling factor and the mechanical quality factor of the piezoelectric material, enabling the design of a piezoelectric ceramic material for use as either a ceramic filter or a mechanical filter.

The instant invention is concerned with piezoelectric ceramic materials having small electromechanical coupling factors and large mechanical quality factors and is concerned as well with such materials having large values of both of these factors.

Present day technology has shown that when a solid solution of lead titanate zirconate $Pb(Ti \cdot Zr)O_3$ is prepared through the admixture of lead-titanate ($PbTiO_3$) and lead zirconate ($PbZrO_3$) with said quantities being added in a mol ratio of about 1:1 and the resulting mixture being sintered and cooled, a resultant piezoelectric material is provided, having good piezoelectric characteristics. Such lead titanate zirconate ceramic materials may be used not only as transducers, such as a mechanical filter element, but also as a ceramic filter element. It should be noted, however, that the piezoelectric properties called for in a transducer are quite different from those required in a ceramic filter element.

The two basic criteria in the assessment of piezoelectric properties are the electromechanical coupling factor and the mechanical quality factor. The former indicates the conversion efficiency of the material in the conversion of electrical oscillations into mechanical oscillations (or vice versa) while the latter indicates the magnitude of energy expended within a piezoelectric ceramic material in performing the conversion of the electromechanical oscillations. In general terms, the larger the value of the mechanical quality factor, the less is the expended energy. It is normally desirable that both factors be as large as possible when a piezoelectric ceramic member is used as a transducer, whereas it is important that the electromechanical coupling factor can assume any designated value within a range between an extremely large and an extremely small value when the member is used as a ceramic filter element. More specifically, the mechanical quality factor should have as large a value as possible, while the electromechanical coupling factor should have a value which is easily adjustable in cases where some value less than the maximum is desired for a specific use or uses.

It is therefore a prime object of the instant invention to provide a piezoeletcric ceramic material containing a suitable additive which effectively lowers the electromechanical coupling factor while increasing the mechanical quality factor. This is achieved by mixing gallium sesquioxide ($Ga_2O_3$) in an amount ranking from 0.05 to 5.0 weight percent to lead titanate zirconate in order to obtain a suitable lead titanate zirconate ceramic material exhibiting properties which make it excellent for use as a ceramic filter element.

Conventional technology has shown that when a solid solution of lead titanate zirconate $Pb(Ti \cdot Zr)O_3$ is prepared through the admixture of lead titanate ($PbTiO_3$) with lead zirconate ($PbZrO_3$) and the resultant mixture is appropriately sintered and cooled, this process yields a piezoelectric ceramic material having strong piezoelectric characteristics, high stability and durability in the face of adverse ambient conditions, with the optimum piezoelectric characteristics being obtained when the subscript $x$ associated with the constituent symbols in the formula $Pb(Ti_xZr_{(1-x)})O_3$ ranges in value from 0.47 to 0.48.

Piezoelectric ceramic materials having the above compositions have become extremely advantageous for use as ceramic and mechanical filter elements due to their numerous advantages characteristics. The preferred characteristics of piezoelectric ceramics for the above applications are as follows:

The requirements of a ceramic filter element are such that the electromechanical coupling factor must be capable of assuming any desired value within a range of values from an exceedingly small to a substantially large magnitude while at the same time, the mechanical quality factor must be capable of assuming as large a value as possible.

With regard to transducer elements it is important that the electromechanical coupling factor and the mechanical quality factor assume values as large as is possible to obtain.

Thus, the main objective becomes one of providing materials having characteristics which conform with those characteristics that are required in transducer elements which are comprised of the ceramic materials, with major concern being given to the provision of a ceramic material capable of assuming a large value of electromechanical coupling factor.

Although the instant invention contemplates use of lead titanate zirconate as the principal constituent of the ceramic material, it has been found that the effect of gallium sesquioxide as an additive agent upon the ceramic material is maintained even though a substitution may be made for the ingredient of lead within the lead titanate zirconate ceramic material. For example, it has been found that the gallium sesquioxide additive continues to yield the excellent characteristics desired in the case where lead is substituted for by at least one of the elements taken from the group consisting of calcium, strontium and barium. It has further been found that equally good results are obtained from the resulting material in the case where up to 65 weight percent of the titanium and zirconium contained within the ceramic material is substituted for by tin. The above substitutions are dealt with in detail in a treatise written by B. Jaffe, R. S. Roth and S. Marzullo which appears in the "Journal of Research of the National Bureau of Standards," 55 (1955) page 239, (1), as well as being discussed in U.S. Pat. 3,068,177. Since the above publications, as well as other independent experimentation, have shown that the substitutions described above do not deteriorate the characteristics of the ceramic material, it should be understood, therefore that the term "lead titanate zirconate" as will be used hereinafter is therefore intended to encompass, as well, those compositions in which up to 23% by weight of the lead has been substituted for by at least one of the elements taken from the group of elements consisting of calcium, strontium, and barium, and/or wherein up to 65% of the titanium and zirconium contained within the ceramic material is substituted for by tin.

In view of the above description one preferred embodiment of the instant invention is therefore concerned with providing a ceramic material comprised of lead titanate zirconate having the formula $Pb(Zr_xTi_ySn_z)O_3$ in which *x, y* and *z* represent the mol fractions of the respective component symbols and have the numeric values:

$x=0.00–0.90$
$y=0.10–0.60$
$z=0.00–0.65$ where $$x+y+z=1.00$$

and wherein up to 23% of lead may be substituted for by one of the elements taken from the group consisting of calcium, strontium, and barium and further containing gallium sesquioxide in amounts ranging from 0.05 to 0.50% of the total weight, for use as an additive agent.

Due to the fact that the improvements in piezoelectric properties of the material are a result of the gallium ions present in gallium sesquioxide contained in the lead titanate zirconate, it is therefore possible to substitute for gallium sesquioxide a gallium compound in the form of a gallium salt or another than trivalent gallium oxide such as gallium monoxide (GaO) for the gallium sesquioxide, with the proviso that the salt or oxide substitute contains an amount of gallium ions equivalent to the number of gallium ions contained within the gallium sesquioxide.

The above, and other objects of the instant invention will become readily apparent when reading the accompanying description and drawings in which the sole figure is a graph showing curves representing the variation in the electromechanical coupling factor and the mechanical quality factor for increasing amounts of gallium sesquioxide which is employed as an additive ingredient to lead titanate zirconate having the formula $Pb(Zr_{0.52}Ti_{0.48})O_3$, and in which the polarizing process for the resulting piezoelectric ceramic material was performed at room temperature.

As shown in curves 14 and 15 of the drawing addition of gallium sesquioxide in amounts of less than 0.05 wt. percent produced no appreciable differences in the *kr* and Q*m* values. Still further, in the case where gallium sesquioxide is added in amounts in excess of 5.0 wt. percent of the total weight of the material, it is found that the electrical resistivity of the resulting material is markedly decreased with the result that the polarization process performed upon the material containing an excess of 5% by weight of gallium oxide proves to be ineffective, thereby yielding an impractical piezoelectric ceramic device. Due to these observations it has been found that the effective range of the additive agent lies within the limits of from 0.05 to 5.0 percent by weight.

The following practical embodiments and their resulting *kr* and *Qm* values will now be set forth:

EMBODIMENT 1

Gallium sesquioxide ($Ga_2O_3$) was added to lead titanate zirconate $Pb(Zr_{0.52}Ti_{0.48})O_3$ having the basic composition consisting of 50 mol percent of lead monoxide, 26 mol percent of zirconium dioxide, and 24 mol percent of titanium dioxide. The amount of gallium sesquioxide added was equal to 0.05 wt. percent of the total weight of the mixture. The mixture was then pulverized and mixed in a ball mill. The resultant was then pre-sintered for approximately one hour at a temperature of 900° C. The pre-sintered product was then pulverized and pressed into a disc form which was then subjected to a sintering process for approximately one hour at a temperature of 1300° C. Silver electrodes were subsequently coated upon the opposite surfaces of the sintered disc and the disc was then subjected to a polarization process with a DC voltage of 50 kv./cm. being applied across the electrodes at room temperature. The ultimate product was then left to cool in a standard atmosphere for approximately 24 hours.

The value or *kr* and Q*m* of a piezoelectric ceramic having the formula $$Pb(Zr_{0.52}Ti_{0.48})O_3 \text{ plus } 0.05\% \text{ by weight of } Ga_2O_3$$

were found to be 40% and 300, respectively. In the absence of the additive agent ($Ga_2O_3$), the values of *kr* and Q*m* of plain lead titanate zirconate $Pb(Zr_{0.52}Ti_{0.48})O_3$, which was prepared in the same manner as the material above, were 41% and 270, respectively. It can be seen from the comparison of the above values, that the *kr* for the Embodiment 1 containing an additive agent remained substantially unaffected while Q*m* was increased to a certain extent, relative to the Q*m* for plain lead titanate zirconate.

All of the succeeding embodiments show the results obtained for products that were prepared using process steps similar to those described above with respect to Embodiment 1 and the values of *kr* and Q*m* are compared with those of plain or unmodified lead titanate zirconate containing no ($Ga_2O_3$) additive, unless otherwise noted.

EMBODIMENT 2

The values of *kr* and Q*m* of a piezoelectric ceramic having the formula $$Pb(Zr_{0.52}Ti_{0.48})O_3 \text{ plus } 0.10\% \text{ by weight of } Ga_2O_3$$

were 34% and 530, respectively. Comparing Embodiment 2 with plain lead titanate zirconate, *kr* decreased considerably, whereas Q*m* increased to the order of twice the value of Q*m* of the plain lead titanate zirconate. This embodiment provides a material which is excellent for use as a ceramic filter element requiring a value of *kr* in the order of 35%.

EMBODIMENT 3

The value of *kr* and Q*m* of a piezoelectric ceramic having the formula $$Pb(Zr_{0.52}Ti_{0.48})O_3 \text{ plus } 0.20\% \text{ by weight of } Ga_2O_3$$

were 20% and 660, respectively. The value of *kr* according to Embodiment 3 decreased appreciably, but the value of Q*m* has been increased considerably over that of plain lead titanate zirconate, or that of Embodiment 2. Therefore this embodiment should provide an excellent ceramic material when a value of kr on the order of 20% is required.

EMBODIMENT 4

The values of *kr* and Q*m* of a piezoelectric ceramic having the formula $$Pb(Zr_{0.52}Ti_{0.48})O_3 \text{ plus } 0.5\% \text{ by weight of } Ga_2O_3$$

were 13% and 710, respectively. The value of *kr* decreased while the value of Q*m* increased as compared with those of any of the preceding embodiments. In other words, this Embodiment 4 provides an excellent material when a value of *kr* on the order of 13% is required.

EMBODIMENT 5

The value of *kr* and Q*m* of a piezoelectric ceramic having the formula $$Pb(Zr_{0.52}Ti_{0.48})O_3 \text{ plus } 1.0\% \text{ by weight of } Ga_2O_3$$

were 13% and 730, respectively.

It can be clearly seen that Embodiment 5, as well as Embodiment 4, is quite suitable for obtaining small values of *kr* of the order of 13%.

It will be understood that the process steps mentioned in Embodiment 1 were employed in forming all of the preceding embodiments. In performing the polarizing process in the course of producing these embodiments, two different methods have generally been employed: a first method is to perform the polarizing process at room temperature as mentioned in Embodiment 1, while a second method is to perform the polarizing process at a considerably higher tmeperature in the range of from 50° to 150° C. The *kr* value of piezoelectric ceramics, which were subjected to the polarizing process in the higher temperature range, are normally larger than those *kr* values for piezoelectric ceramics which were subjected to the polarizing process at room temperature. This fact may be advantageously utilized to further control the value of *kr* of a piezoelectric ceramic. Various examples of this phenomenon are also indicated in the following embodiments.

EMBODIMENT 6

The values of *kr* and Q*m* of a piezoelectric ceramic having the same composition as Embodiment 5 and subjected to the polarizing process at 100° C., were 43% and 650, respectively. The value of *kr* has improved markedly, whereas the value of Q*m* decreased slightly, as compared with the *kr* and Q*m* values of Embodiment 5. As compared with the *kr* and Q*m* values of plain lead titanate zirconate containing no additive agent as in Embodiment 1, the value of *kr* is substantially unchanged while the value of Q*m* is improved markedly.

EMBODIMENT 7

The values of *kr* and Q*m* of a piezoelectric ceramic having the formula $Pb(Zr_{0.52}Ti_{0.48})O_3$ plus 2.0% by weight of $Ga_2O_3$ which was subjected to the polarizing process at room temperature were 14% and 710, respectively. The values of *kr* and Q*m* of the same piezoelectric ceramic, which was subjected to the polarizing process at 100° C., were 39% and 640, respectively. Comparing these values of *kr* and Q*m*, it is evident that this embodiment provides a material which is excellently suited for use as a ceramic filter element.

EMBODIMENT 8

The values of *kr* and Q*m* of a piezoelectric ceramic having the formula $Pb(Zr_{0.52}Ti_{0.48})O_3$ plus 3.0% by weight of $Ga_2O_3$ and subjected to the polarizing process at room temperature were 13% and 660, respectively. The corresponding *kr* and Q*m* values of the same piezoelectric ceramic subjected to the polarizing process at 100° C. were 29% and 550, respectively. It is evident from this that Embodiment 8 provides an excellent ceramic filter element material.

EMBODIMENT 9

The values of *kr* and Q*m* of a piezoelectric ceramic having the formula $Pb(Zr_{0.52}Ti_{0.48})O_3$ plus 5.0% by weight of $Ga_2O_3$ and which was subjected to the polarizing process at room temperature were 13% and 480, respectively. The corresponding values of the same ceramic which was subjected to the polarizing process at 100° C. were 13% and 490, respectively.

The values of *kr* and Q*m* attained by the former lower temperature polarizing process are extremely close to those attained by the latter (higher temperature) polarizing process. However, this embodiment provides an excellent piezoelectric material which requires a small value of *kr*.

Lead titanate zirconate material containing more than 5.0% by weight of $Ga_2O_3$ assumes a two-phase composition without forming a homogeneous phase, with the result that the specific resistivity is decreased and the polarizing process is ineffective. In other words, the maximum amount of the addition of $Ga_2O_3$ is substantially restricted to an upper limit of approximately 5.0 weight percent.

EMBODIMENT 10

The values of *kr* and Q*m* of lead titanate zirconate having the formula $Pb(Zr_{0.54}Ti_{0.46})O_3$ plus 0.20% by weight of $Ga_2O_3$ and which was subjected to the polarizing process at room temperature were 28% and 580, respectively. Comparing this with Embodiment 3, it is noted that the value of *kr* has been increased by 8% and the value of Q*m* has been decreased by 80. It will be evident that the object of decreasing the value of *kr* and increasing the value of Q*m* can be fully met by the addition of $Ga_2O_3$ in spite of changes of this order in the basic composition.

When this material is subjected to the polarizing process at a higher temperature, the values of *kr* and Q*m* become 45% and 515, respectively. Compared with the performance of the polarizing process at room temperature, the value of *kr* increased markedly while the value of Q*m* has decreased slightly. This embodiment also demonstrates that the employment of the polarizing process at a high temperature level is effective for increasing the value of *kr*.

EMBODIMENT 11

The values of *kr* and Q*m* of lead titanate zirconate having the formula $Pb(Zr_{0.50}Ti_{0.50})O_3$ plus 0.2 weight percent $Ga_2O_3$ which was subjected to the polarizing process at room temperature were 8% and 1020, respectively. The same material subjected to the polarizing process at 100° C. possessed *kr* and Q*m* values of 21% and 1030, respectively. It is evident by comparing the above two cases that the value of Q*m* has remained substantially unchanged while the value of *kr* has been increased.

These values of *kr* and Q*m* obtained by the two polarizing processes yield excellent materials when values of *kr* of the order of 8% or 20%, respectively, are desired.

It can be seen from the foregoing description that the instant invention provides a novel piezoelectric ceramic material having an additive ingredient which is quite useful in controlling the mechanical quality factor and electromechanical coupling factor values of the piezoelectric material and further more specifically has the capabilities of markedly improving the mechanical quality factor and for controlling the mechanical coupling factor to assume any value within a wide range of values.

Although there have been described preferred embodiments of this novel invention, many variations and modificiations will now be apparent to those skilled in the art.

The embodiments of the invention in which an exclusive privilege or property is claimed are defined as follows:

1. A piezoelectric ceramic material having the formula $Pb_{1-u}Me_u(Zr_xTi_ySn_z)O_3$, wherein Me represents at least one member selected from the group consisting of calcium, strontium, barium and mixtures thereof, the subscripts *u, x, y* and *z* have the numerical values $u$=0.00–0.23,
$x$=0.00–0.90,
$y$=0.10–0.60,
$z$=0.00–0.65, and
$x+y+z=1.00$;

and wherein said ceramic contains from 0.05 to 5.0 percent by weight gallium sesquioxide additive.

2. A piezoelectric ceramic material having the formula $Pb(Ti_yZr_{1-y})O_3$, wherein $y$ has a value of from 0.47 to 0.48, and wherein said ceramic contains from 0.05 to 5.0 percent by weight gallium sesquioxide.

(References on following page)

References Cited

UNITED STATES PATENTS

| | | | |
|---|---|---|---|
| 2,961,554 | 11/1960 | Cook et al. | 106—39 |
| 2,980,546 | 4/1961 | Plesner et al. | 106—39 |
| 3,068,177 | 12/1962 | Sugden | 252—62.9 |

OTHER REFERENCES

Tien et al.—Effect of Additives on Properties of Lead Titanate—Journal of the American Ceramic Society, volume 45, No. 12, Dec. 1, 1962, pages 567–571.

Matsuo et al.—Lead Titanate Doped with Manganese Oxide—Journal of the American Ceramic Society, volume 48, No. 2, February 1965, pages 111–112.

TOBIAS E. LEVOW, Primary Examiner

R. D. EDMONDS, Assistant Examiner

U.S. Cl. X.R.

106—39